(12) United States Patent
Chiou

(10) Patent No.: US 6,704,691 B2
(45) Date of Patent: Mar. 9, 2004

(54) METHOD AND SYSTEM FOR IN-LINE MONITORING PROCESS PERFORMANCE USING MEASURABLE EQUIPMENT SIGNALS

(75) Inventor: Hung-Wen Chiou, Hsinchu (TW)

(73) Assignee: Promos Technologies, Inc. (TW)

( * ) Notice: Subject to any disclaimer, the term of this patent is extended or adjusted under 35 U.S.C. 154(b) by 97 days.

(21) Appl. No.: 10/054,822

(22) Filed: Jan. 25, 2002

(65) Prior Publication Data

US 2003/0033120 A1 Feb. 13, 2003

(30) Foreign Application Priority Data

Jul. 18, 2001 (TW) .................................. 090117524

(51) Int. Cl.$^7$ ............................................... G06F 15/00
(52) U.S. Cl. ........................ 702/188; 438/710; 702/85; 702/121; 702/182
(58) Field of Search ....................... 702/85, 121, 122, 702/182, 183, 188, 189; 438/710; 427/585; 700/110, 111, 121

(56) References Cited

U.S. PATENT DOCUMENTS 5,864,773 A * 1/1999 Barna et al. ................ 702/85
6,446,022 B1 * 9/2002 Coss, Jr. et al. ............ 702/121
6,455,437 B1 * 9/2002 Davidow et al. ........... 438/710
6,556,949 B1 * 4/2003 Lyon .......................... 702/182

\* cited by examiner

*Primary Examiner*—Michael Nghiem
*Assistant Examiner*—John H Le
(74) *Attorney, Agent, or Firm*—Birch, Stewart, Kolasch & Birch, LLP

(57) ABSTRACT

A method and system for in-line monitoring process performance during wafer fabrication. First signals generated by a fabrication tool are collected and filtered to exclude abnormal signals while a model wafer is processed. The filtered first signals are regulated and normalized to generate model wafer data. After the fabrication process is completed, the model wafer is measured to generate a measured value representing the process quality thereof. The model wafer data and the measured value of the model wafer are used to build a correlation model by a correlation unit. Second signals generated by the fabrication tool are collected when a run wafer is processed, and then filtered to exclude abnormal signals. The filtered second signals are regulated and normalized to generate run wafer data. A predicted value representing the process quality of the run wafer is generated by inputting the run wafer data into the correlation model.

15 Claims, 7 Drawing Sheets

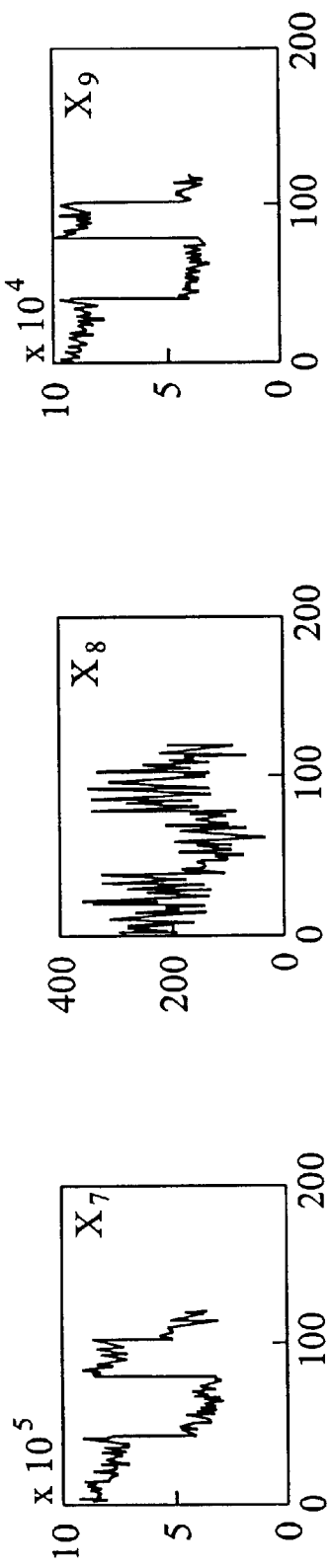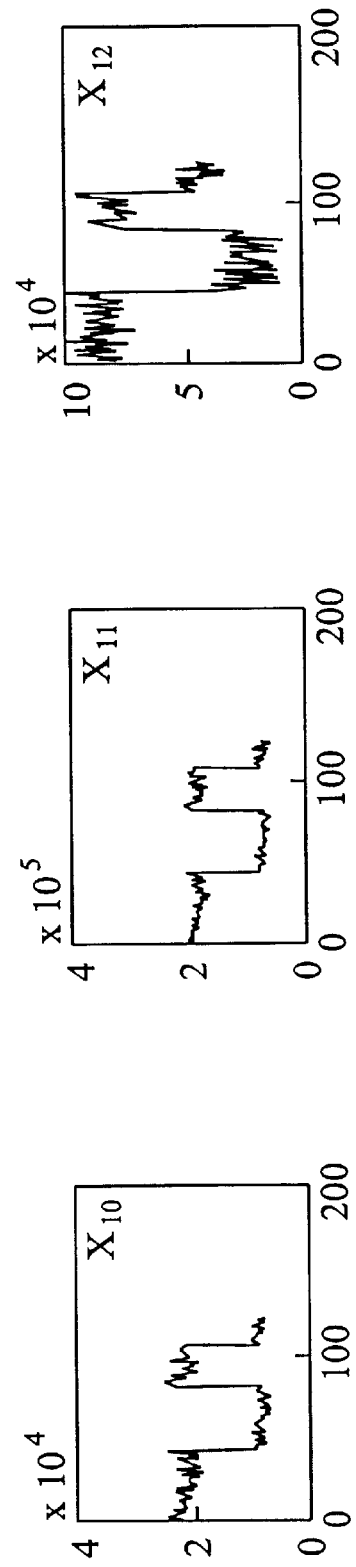
FIG. 3g  FIG. 3h  FIG. 3i
FIG. 3j  FIG. 3k  FIG. 3l

METHOD AND SYSTEM FOR IN-LINE MONITORING PROCESS PERFORMANCE USING MEASURABLE EQUIPMENT SIGNALS

FIELD OF THE INVENTION

The present invention relates to in-line monitoring of semiconductor quality, and more particularly to a method and system for in-line monitoring semiconductor quality using measurable equipment signals.

BACKGROUND OF THE INVENTION

Process performance in semiconductor fabrication can be monitored by in-line analysis. In-line analysis is usually performed with analytical tools after certain manufacturing steps or processes have been completed to determine the quality of the wafer. However, in-line monitoring can become a bottleneck in the production flow because the so many wafers are produced in one lot. There are always more fabrication tools than analytical tools in semiconductor plants; thus, examining every wafer in the entire lot will take a long time and delay the production schedule. The shorten the in-line examining time, conventionally, only a few wafers are checked by in-line tools and the examining results are considered sufficient to represent the entire lot. The in-line analysis tools can be destructive, such as Secondary Ion Mass Spectrosmetry (SIMS) for depth profiling or non-destructive, such as In-line CD-SEM for measuring the size of critical dimension, profiler for measuring etch depth or KLA scan for checking particle defect on the wafers.

One disadvantage of the conventional in-line monitoring is that the quality of the whole lot is statistically estimated from the test results of the samples, when actual results can be diverse. There is uncertainty of the exact quality of the un-sampled wafers. For high-priced IC products, the low quality of the un-sampled products will cause a great loss.

Another disadvantage is time delay. Although the in-line analytical instruments are designed for rapidly analysis, it still takes time to examine the samples and the lot is held back. Otherwise, the lot may continue in the production flow while the samples are being analyzed, but if the outcome are unsatisfactory, it is usually too late to stop the lot and to make proper remedies. The lot may be discarded, causing a great loss for the semiconductor manufacturer and a time delay to reproduce the lot.

Therefore, there is a need for a method to in-line monitoring the process performance of semiconductor fabrication in a quick and efficient way.

SUMMARY OF THE INVENTION

To solve the problems mentioned above, one object of the present invention is to provide a method and system achieving rapid in-line monitoring of process performance during semiconductor fabrication.

Another object of the present invention is to provide a method and system for in-line monitoring of process performance during semiconductor fabrication wherein the quality of every wafer can be tested.

An additional object of the present invention is to provide a method and system for in-line monitoring of process performance during semiconductor fabrication using fabrication equipment signals.

According to the present invention, a method and system for in-line monitoring process performance during wafer fabrication is provided. First, first signals generated by a fabrication tool are collected and filtered by a filtering unit to exclude abnormal signals while a model wafer processes. Then, the filtered model signals are regulated and normalized by a normalizing unit to generate model wafer data. After the fabrication process is completed, the model wafer is measured with an analytical tool to generate a measured value representing the process quality of the model wafer. The model wafer data and the measured value of the model wafer are used by a correlation unit to build a correlation model. After the correlation model is built, the process performance can be predicted as follows. Second signals generated by the fabrication tool are collected when a run wafer is processed, and then filtered to exclude abnormal signals by the filtering unit. Then, the filtered second signals are regulated and normalized by the normalizing unit to generate run wafer data. A predicted value representing the process quality of the run wafer is generated by inputting the run wafer data into the correlation model.

The correlation unit in the present invention comprises a switch for alternately selecting a modeling function or a predictive function. When the modeling function is selected, the correlation model is built by inputting the model wafer data and measured values of wafer processing quality, and when the predictive function is selected, a predicted value of process quality of a run wafer is generated by inputting wafer data of the run wafer into the correlation model.

The wafer data and the measured values of a plurality of model wafers can be inputted into the correlation unit to generate a best fit correlation model for process performance prediction. The data can be accumulated and stored in a database. Further, when the measured value of a run wafer is outside a predetermined value, the measured value of said wafer data can be inputted into the correlation unit to update the correlation model.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

Reference is made in detail to a preferred embodiment of the present invention which illustrate the method and system for in-line monitoring semiconductor quality on, but not limited to, a etcher using measurable etcher signals.

Figure 1:
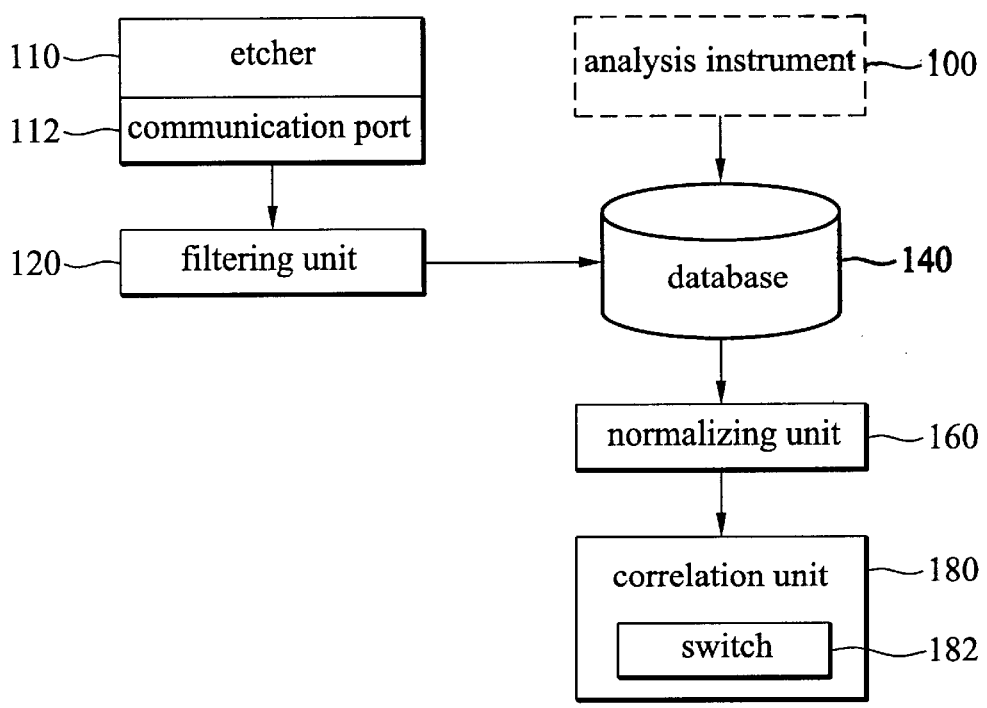
FIG. 1 shows a system structure for in-line monitoring the process performance on an etcher according to a preferred embodiment of the present invention.

FIG. 1 shows a computer implemented system structure for in-line monitoring process performance on an etcher. Filtering unit 120 is used to collect the measurable signals generated by the etcher 110 when a wafer is process thereon using a communication port 112. If, for example, a polysilicon recess etching is performed on the etcher, the measurable signals could be chamber pressure, chamber dc bias, forward power, reflected power, Rf 2 forward power, Rf 2 reflected power, throttle valve step, chamber helium flow, Helium pressure reading, ESC current readback, ESC voltage readback, chamber match load position, chamber match tune position, C12 flow rate, SF6 flow rate, CF4 flow rate, and HE_02 flow rate, as shown in Table 1. It is understood, however, that the measurable signals may differ from the design, function and type of the fabrication tool or which recipe is selected. The present invention is not limited to parameters X1–X17.

TABLE 1

X1: Chamber Pressure
X2: Chamber dc bias
X3: Forward power
X4: Reflected power
X5: Rf 2 forward power
X6: Rf 2 reflected power
X7: Throttle valve step
X8: Chamber helium flow
X9: Helium pressure reading
X10: ESC current readback
X11: ESC voltage readback
X12: Chamber match load position
X13: Chamber match tune position
X14: CL2 flow rate
X15: SF6 flow rate
X16: CF4 flow rate
X17: HE_02 flow rate After collecting the measurable signals, the filtering unit 120 filters the signals to exclude the abnormal data. The filtered signals are stored in a database 140 and further normalized and regulated by a normalizing unit 160 to generate the wafer data. After the manufacturing process complete on the etcher 110, the wafer can be analysis by an analysis tool 100, e.g. Profiler or KLA scan. The measured value representing the process quality of the wafer, e.g. recess depth or defect count, is also stored in the database 140.

Still referring to FIG. 1, the correlation unit 180 comprises a switch 182 for alternately selecting a modeling function or a predictive function. When the modeling function is selected, a correlation model is built by inputting the wafer data generated by the fabrication tool and the measured value into the correlation unit 180. In a preferred embodiment, the correlation model is a linear or artificial neural network correlation model. The correlation model represents the correlation between the tool signals and the process performance.

After the correlation model is built using the wafer data and measured values of model wafers, the process performance of the subsequent wafers can be predicted using the correlation model. When the predictive function of the correlation unit 180 is selected, the processing quality of a run wafer is predicted by inputting the corresponding wafer data into the correlation model.

Figure 2:
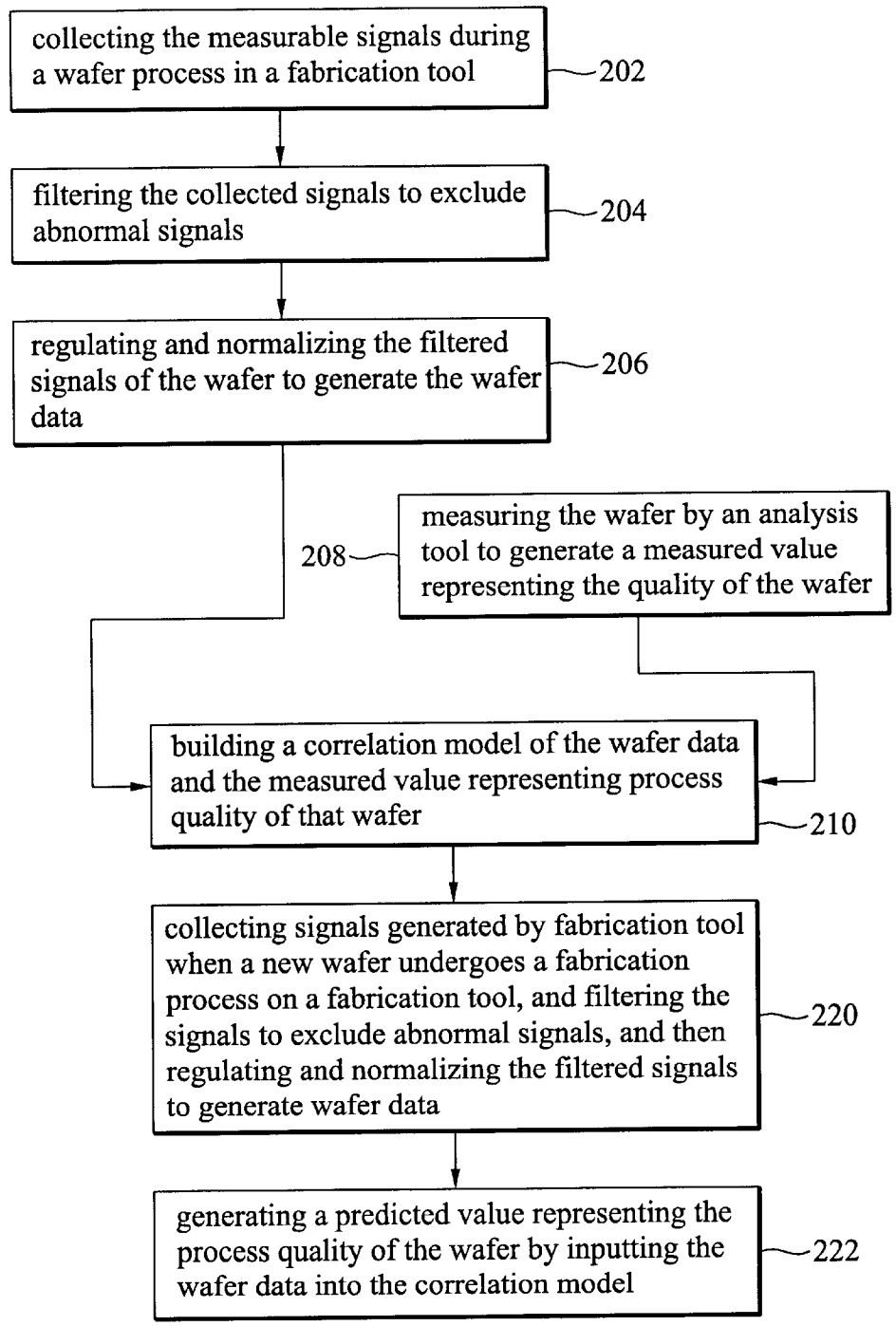
FIG. 2 is the process flow for in-line monitoring the process performance using measurable equipment signals according to a preferred embodiment of the present invention.

FIG. 2 shows the process flow for in-line monitoring the process performance during wafer fabrication using measurable equipment signals. During a wafer process in a fabrication tool, the measurable signals are collected at 202. In one embodiment, when a wafer is undergoing a polysilicon etching process on an etcher, the signals of parameters X1–X17 in table 1 are collected by the filtering unit 120 from the communication port 112 of the etcher 110. The collected signals are further filtered to exclude abnormal values at 204.

The signals can be filtered by the filtering unit 120 to exclude the aberrational signals using statistical calculations. A variation specification can be set according to the historical data of a given piece of equipment and recipe to define an acceptable range for the signals. Qualified signals are obtained based on the variation specification and can be stored in the database 140 for process performance prediction in the subsequent steps. The unqualified signals can also be stored in the database 140 for process performance prediction in subsequent steps. The unqualified signals can also be stored in the database 140 for further analysis to determine the cause of the aberration. The unqualified signals may occur because of power fluctuations or abnormal condition inside the fabrication tool. Records and alarms can be set when the unqualified signals are analyzed.

Referring still to FIG. 2, the filtered signals of the wafer are normalized at 206. The normalizing unit 160 processes the filtered signals by, for example, classification, integration and/or averaging to generate the wafer data. It is understood, however, that other methods of processing may be used. The classification depends on the parameters, e.g. X1–X17, of the fabrication tool. There are some parameters having greater effect than others on certain monitored qualities, e.g. recess depth or defect count for etching. The signals of a highly related parameter can be classified in advance for subsequent modeling.

The normalization can be achieved by following integrated:

$$\frac{\int |Xi|}{time}$$

Figure 3C:
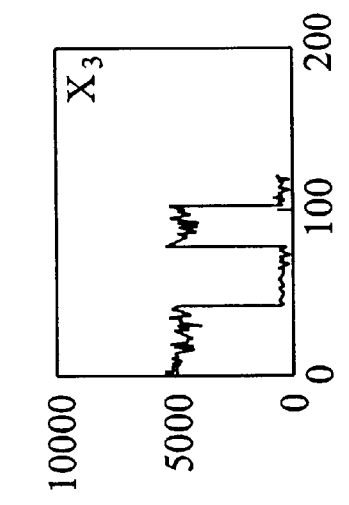
FIG. 3 shows the integrated data distribution of X1–X17 according to one embodiment of the present invention.
Figure 3B:
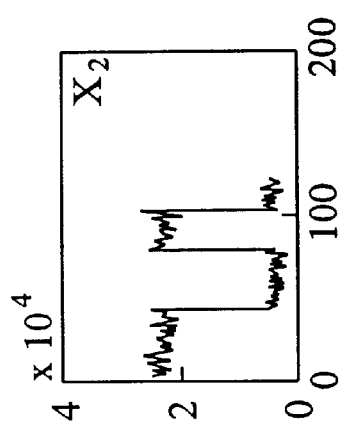
Figure 3A:
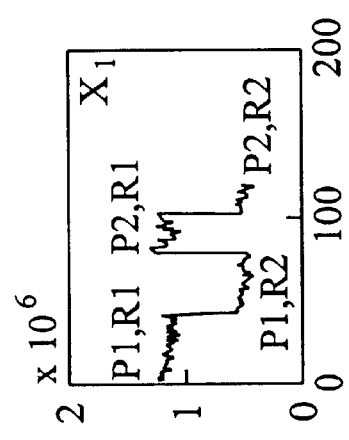
Figure 3F:
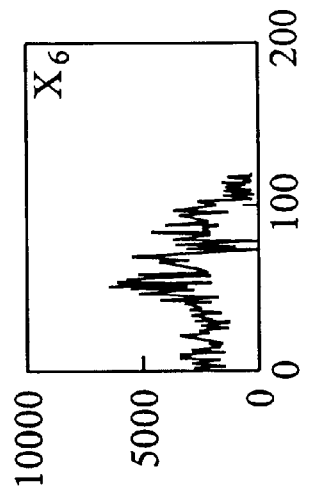
Figure 3E:
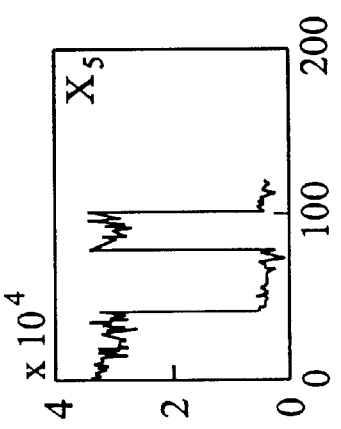
Figure 3D:
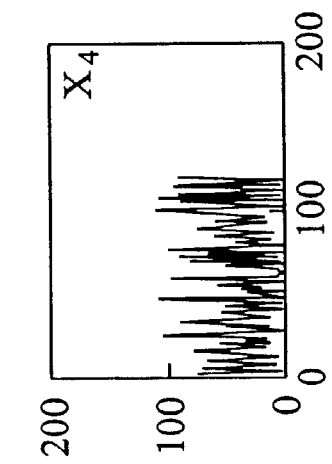
Figure 3O:
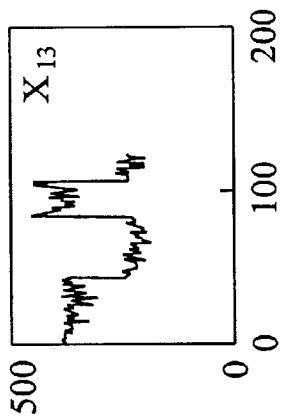
Figure 3N:
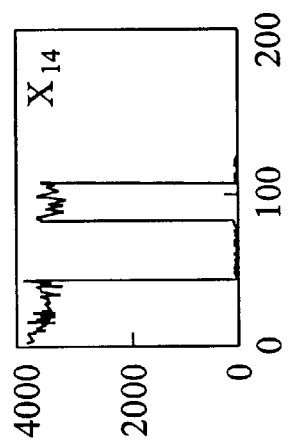
Figure 3Q:
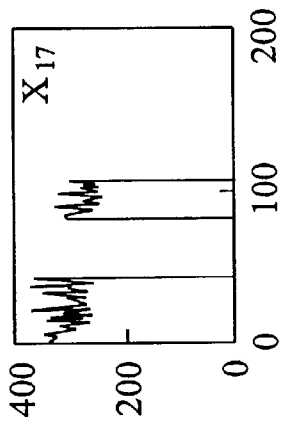
Figure 3M:
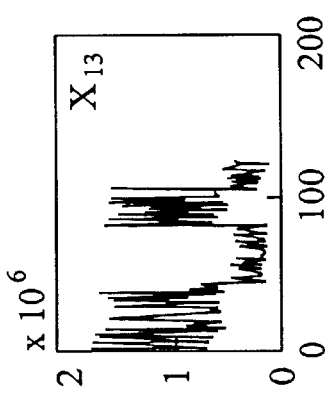
Figure 3P:
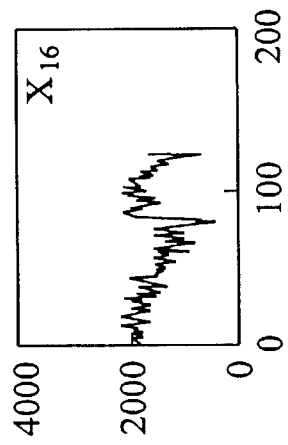

FIG. 3a–3q show the distribution of the integrated data of X1–X17. The horizontal coordinate shows the number of wafers and the vertical coordinate represents each wafer's signals integrated by time.

The signals can be collected and processed by computer as soon as the manufacturing process is completed. The quality of the wafer is then measured by an analysis tool, e.g., a Profiler for recess depth or a KLA scan for defect count, at 208. The measured quality data represents the results of the manufacturing process and are also stored in the database 140.

A correlation model is built at 210 using the wafer data and the measured value representing process quality of that wafer. The wafer data and the measured value of at least one wafer are inputted into the correlation unit 180 to build a best-fit correlation model. The correlation model can be a linear correlation model or an artificial neural network model, which depends on the characteristics of the wafer data and the measured value of wafers. An artificial neural network modeling is one choice to deal with the non-linear relationship.

In one embodiment, a linear correlation model is built using the wafer data of parameters X1–X17 and measured recess depth of 225 wafers on which an etch has been performed using a chosen recipe on the etcher as follows:

Recess depth = $1634.2 + 1.7294e - 004 * X1 + 0.0647 * X2 -$

-continued $$0.12762*X3 - 0.42437*X4 - 0.0038732*X5 - 0.05556*X6 -$$
$$0.00022498*X7 - 0.14172*X8 - 0.0038897*X9 + 0.042517*X10 -$$
$$0.010938*X11 - 0.0035478*X12 + 0.00029454*X13 +$$
$$0.29001*X14 + 0.30364*X15 + 0.16058*X16 + 0.20044*X17$$

After the correlation model is built, process performance can be predicted. When a new wafer undergoes a polysilicon etching process on the etcher 110, signals generated by the fabrication tool are collected, filtered to exclude abnormal signals, and then normalized to generate wafer data at 220.

To predict the process performance, the wafer data of the new wafer is inputted into the correlation model at 222 to generated the predicted value representing the process quality. The switch 182 of the correlation unit 180 is set to the predictive function. By selecting the predictive function, a predicted value representing the process quality of a run wafer is generated by inputting wafer data into the correlation model.

To check the accuracy of predicted value, the new wafer can be measured by an analytical tool to examine the process performance. When the deviation between the predicted value and the measured value is outside of a predetermined range, the wafer data can be inputted into the correlation unit 180 to update the correlation model.

Figure 4:
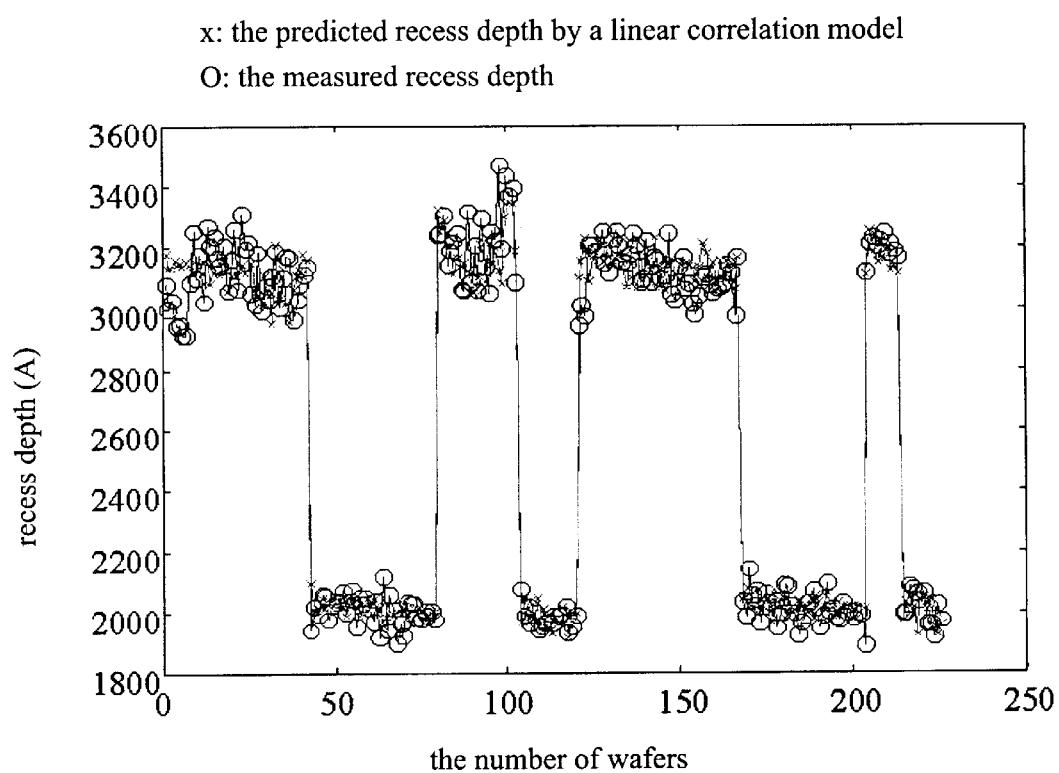
FIG. 4 shows the distribution of the predicted recess depth by linear correlation model and measured recess depth of 225 wafers according to one embodiment of the present invention.

Referring to FIG. 4, the predicted recess depth obtained by a linear correlation model and the measured recess depth of 225 wafers are shown. The horizontal coordinate is the number of wafers and the vertical coordinate is recess depth of the wafers. As seen in FIG. 4, the X representing the predicted recess depth by the linear correlation model matches the O representing the measured recess depth very well.

Figure 5:
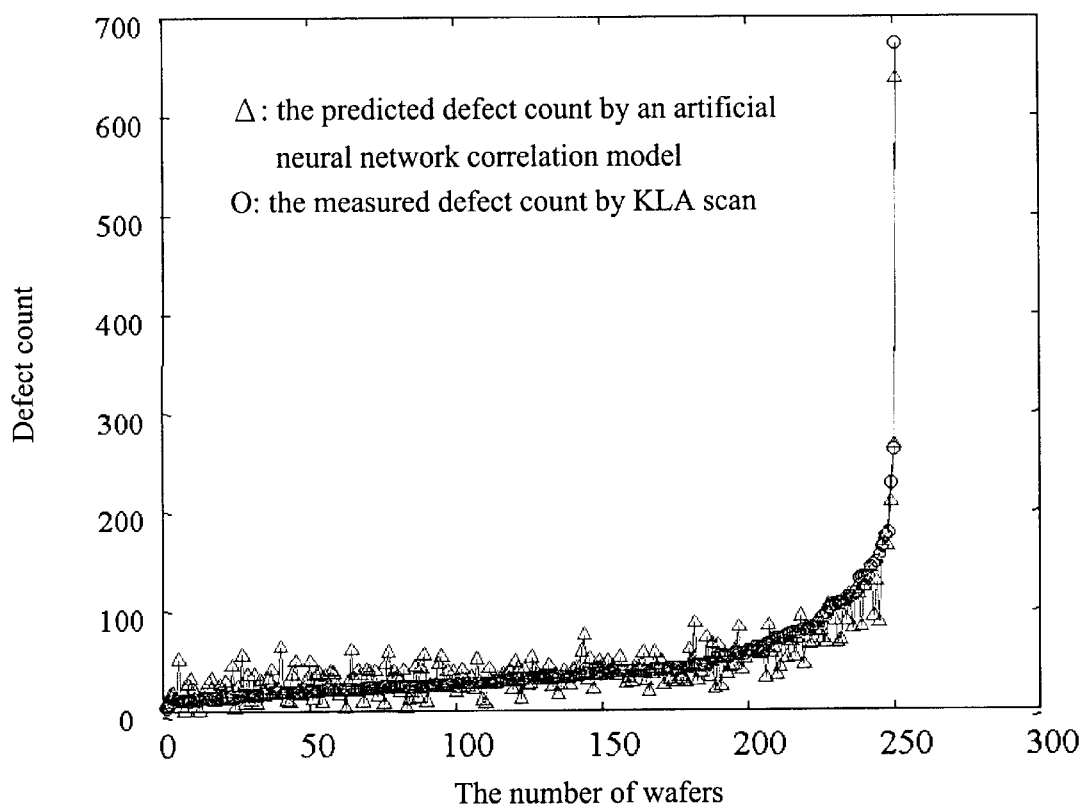
FIG. 5 shows the distribution of the predicted defect count by an artificial neural network model and measured results according to one embodiment of the present invention.

In another embodiment, the defect count is the key point of manufacturing result. The defect count on wafers is predicted by an artificial neural network model and the measured results are shown in FIG. 5. In FIG. 5, the horizontal coordinate is the number of wafers and the vertical coordinate is defect count of the wafers. The Δ representing the predicted defect count matches the O representing the measured defect count by a KLA scan. The data in the database 140 grows as wafer fabrication proceeds, and as the database grows, the predicted value generated by the correlation model approaches the actual manufacturing performance.

Wafer quality depends on the manufacturing conditions inside the fabrication tool and therefore the signals generated by the fabrication tool relate the process performance. With increasing computing power, the time spent data processing in the present invention may only take a few seconds. The equipment signals can be immediately processed to generate a predicted value representing the wafer quality, e.g. recess depth or defect count, at the end of a fabrication process. The operator can check the predicted result and make corresponding response. For example, when predicted value of wafers are abnormal, the lot can be stopped before go on to next step and made detail examination to find out the cause. Expect for control samples, there is no need to wait for the result of examination by analytical tools. Thus, the present invention is convenient and time-saving.

Another advantage of the present invention is that every wafer can be in-line monitored instead of sampling, which has been the common practice. It is time consuming to check every wafer using only a few in-line monitoring instruments and it is also impracticable for the manufacturer to buy many expensive in-line monitoring instruments to allow wafers to be analyzed at the same rate that they are fabricated. The present invention provides a time-saving way for in-line monitoring the wafer quality of every wafer utilizing the high speed processing ability of a computer and correlation models. When the predicted value of one wafer is abnormal, the wafer can be picked out for further analysis. For valuable and high priced products, in-line monitoring every wafer provides a more precise way to control wafer quality.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for in-line monitoring process performance during wafer fabrication using a fabrication tool, comprising the steps of:
   (a) collecting first signals generated by the fabrication tool when a model wafer is processed;
   (b) filtering the first signals to exclude abnormal signals;
   (c) regulating and normalizing the filtered first signals to generate model wafer data;
   (d) measuring the model wafer to generate a measured value representing the process quality thereof;
   (e) building a correlation model of the model wafer data and the measured value of the model wafer;
   (f) collecting second signals generated by the fabrication tool when a run wafer is processed;
   (g) filtering the second signals to exclude abnormal signals;
   (h) regulating and normalizing the filtered second signals to generate run wafer data; and
   (i) generating a predicted value representing the process quality of the run wafer by inputting the run wafer data into the correlation model.

2. The method as claimed in claim 1, wherein the correlation model is built by repeating steps (a) to (e) using a plurality of model wafers.

3. The method as claimed in claim 1, wherein the step of regulating and normalizing the filtered first signals is achieved by classification, averaging and/or integration.

4. The method as claimed in claim 1, wherein the fabrication tool is an etcher and measured value is the recess depth.

5. The method as claimed in claim 1, further comprising a step (j) of: measuring at least one run wafer to generate a measured value of the run wafer and when the measured value of the run wafer is outside of a predetermined range, inputting the measured value of the run wafer data into the correlation model to update the correlation model.

6. The method as claimed as claim 1, wherein the fabrication tool is an etcher and measured value is the number of defects on the model wafer.

7. The method as claimed in claim 1, wherein the correlation model is a linear correlation model.

8. The method as claimed as claim 1, wherein the correlation model is artificial neural network correlation model.

9. A system for in-line monitoring process performance during wafer fabrication using a fabrication tool, comprising:

a filtering unit to collect signals generated by the fabrication tool while wafers are processed thereon and filter the signals to exclude abnormal signals;

a normalizing unit to regulate and normalize the filtered signals to generate wafer data; and a correlation unit, comprising a switch for alternately selecting a modeling function or a predictive function, wherein when the modeling function is selected, a correlation model is built by inputting the wafer data and measured value representing the process quality of a wafer measured by an analytical tool, and when the predictive function is selected, a predicted value representing process quality of a wafer is generated by inputting wafer data of the chosen wafer into the correlation model.

10. The system as claimed in claim 9, wherein the normalizing unit regulates and normalizes the filtered signals by classification, averaging and/or integration to generate wafer data.

11. The system as claimed in claim 9, wherein the fabrication tool is an etcher and the measured value is the recess depth of the wafers.

12. The system as claimed in claim 9, wherein the fabrication tool is an etcher and the measured value is count the defects on the wafers.

13. The system as claimed in claim 9, wherein the correlation model is a linear correlation model.

14. The system as claimed in claim 9, wherein the correlation model is an artificial neural network correlation model.

15. The system as claimed in claim 9, further comprising a database for storage of the wafer data and the measured value of the wafer process performance.

* * * * *